United States Patent
Kim et al.

(10) Patent No.: US 8,905,239 B2
(45) Date of Patent: Dec. 9, 2014

(54) MAGAZINE FOR LOADING A LEAD FRAME

(71) Applicant: Samsung Electronics Co., Ltd., Suwon-si (KR)

(72) Inventors: Doojin Kim, Chungcheongnam-do (KR); Hyungjin Lee, Chungcheongnam-do (KR); Youngsik Kim, Chungcheongnam-do (KR); Sungbok Hong, Chungcheongnam-do (KR); Yongmin Kim, Chungcheongnam-do (KR); Chulmin Kim, Chungcheongnam-do (KR)

(73) Assignee: Samsung Electronics Co., Ltd. (KR)

( * ) Notice: Subject to any disclaimer, the term of this patent is extended or adjusted under 35 U.S.C. 154(b) by 4 days.

(21) Appl. No.: 13/783,657

(22) Filed: Mar. 4, 2013

(65) Prior Publication Data

US 2013/0256186 A1  Oct. 3, 2013

(30) Foreign Application Priority Data

Mar. 30, 2012  (KR) ........................ 10-2012-0033570

(51) Int. Cl.
*B65D 85/00* (2006.01)
*H01L 21/673* (2006.01)

(52) U.S. Cl.
CPC ........ *H01L 21/6735* (2013.01); *H01L 21/6732* (2013.01)
USPC .......................... 206/711; 206/454; 211/41.18

(58) Field of Classification Search
USPC ............ 206/454, 710, 711; 211/41.17, 41.18; 257/685; 361/724–726, 801; 414/403, 414/749.6, 810, 905, 937
See application file for complete search history.

(56) References Cited

U.S. PATENT DOCUMENTS

| | | | | |
|---|---|---|---|---|
| 5,128,833 A * | 7/1992 | Lin et al. | ..................... | 211/41.17 |
| 5,853,214 A * | 12/1998 | Babbs et al. | .................. | 206/711 |
| 6,082,798 A * | 7/2000 | Moges et al. | ................. | 414/940 |
| 6,385,050 B1 * | 5/2002 | Orita et al. | ................. | 211/41.17 |
| 7,051,887 B2 * | 5/2006 | Huang et al. | .............. | 211/41.18 |
| 7,086,540 B2 * | 8/2006 | Huang et al. | .............. | 211/41.18 |
| 7,163,110 B2 * | 1/2007 | Huang et al. | .............. | 211/41.18 |
| 7,891,937 B2 * | 2/2011 | Mohamed | ..................... | 414/810 |

FOREIGN PATENT DOCUMENTS

| | | |
|---|---|---|
| JP | 199411392 | 2/1994 |
| JP | 08288689 | 1/1996 |
| JP | 2568386 | 1/1998 |
| JP | 10145063 | 5/1998 |
| JP | 10190262 | 7/1998 |
| JP | 2000294955 A * | 10/2000 |
| JP | 2002160827 | 6/2002 |
| JP | 2002167007 | 6/2002 |
| JP | 2002171085 | 6/2002 |
| JP | 2006016096 | 1/2006 |

(Continued)

*Primary Examiner* — Bryon Gehman
(74) *Attorney, Agent, or Firm* — Onello & Mello, LLP (57) ABSTRACT

A strip member loading magazine, which may load strip members such as semiconductor integrated circuit lead frames, for example, may include a bottom plate, a plurality of first slot plates provided at opposite sides of the bottom plate, a top plate fixed to a top portion of the first slot plates to be parallel to the bottom plate, second slot plates disposed to face each other between the first slot plates and be able to be moved, and locking units fastening the second slot plates to at least the top or bottom plate, the second slot plates being fastened parallel to the first slot plates.

20 Claims, 10 Drawing Sheets

(56) References Cited

FOREIGN PATENT DOCUMENTS

| KR | 1019990065999 | 8/1999 |
| KR | 1019990068949 | 9/1999 |
| KR | 1020010000928 | 1/2001 |
| KR | 1020030051926 | 6/2003 |
| KR | 1020060025779 | 3/2006 |
| KR | 100618421 | 8/2006 |
| KR | 1020060097075 | 9/2006 |
| KR | 1020070053395 | 5/2007 |
| KR | 1020070097604 | 10/2007 |
| KR | 200449469 | 6/2010 |
| KR | 1020110037082 | 4/2011 |

\* cited by examiner

MAGAZINE FOR LOADING A LEAD FRAME

CROSS-REFERENCE TO RELATED APPLICATIONS

This U.S. non-provisional patent application claims priority under 35 U.S.C. §119 to Korean Patent Application No. 10-2012-0033570, filed on Mar. 30, 2012, in the Korean Intellectual Property Office, the entire contents of which are hereby incorporated by reference.

BACKGROUND OF THE INVENTION

Embodiments in accordance with principles of inventive concepts relate to a loading apparatus, and in particular, to a magazine for loading a plurality of lead frames.

Many different kinds of packaging apparatuses may be used to fabricate a semiconductor chip package and, a magazine may be used to transport a semiconductor chip package between various packaging apparatuses. Such a magazine may be configured to contain a plurality of strip members, such as a printed circuit board, a circuit film, or a lead frame, for example. A lead-frame-loading magazine may be used to deliver a plurality of lead frames, to which a dicing process has been performed, into packaging apparatuses for subsequent processes, such as a wire bonding, molding, trimming, forming, or ink marking, for example. The lead frames in a magazine may be sequentially unloaded to a part of the packaging apparatus, operated upon by the packaging apparatus, then unloaded from the packaging apparatus back to the magazine sequentially. However, strip members of different sizes cannot be contained in a conventional lead-frame-loading magazine, and this may limit productivity.

SUMMARY

Exemplary embodiments in accordance with principles of inventive concepts include a strip member (e.g., lead frame) loading magazine, that includes a bottom plate, a plurality of first slot plates provided at opposite sides of the bottom plate and substantially orthogonal to the plane of the bottom plate, a top plate fixed to a top portion of each of the first slot plates to be parallel to the bottom plate, second slot plates disposed to face each other between the first slot plates, wherein the second slot plates adapted for movement in a direction parallel to the bottom and top plates, and locking units fastening the second slot plates to the top plate, the second slot plates being fastened parallel to the first slot plates.

In an exemplary embodiment in accordance with principles of inventive concepts, the loading magazine includes locking units that are disposed at upper corners of the second slot plates, respectively.

In an exemplary embodiment in accordance with principles of inventive concepts, the top plate includes a guide hole adapted for sliding the locking units therein to move the second slot plates and the top plate includes locking holes defining fastening positions of the second slot plates in the guide hole.

In an exemplary embodiment in accordance with principles of inventive concepts, the locking units comprises a plunger to be inserted into the guide hole or the locking holes.

In an exemplary embodiment in accordance with principles of inventive concepts, the plunger comprises a first shaft fastened to the second slot plate, a ram provided on the first shaft, a cylinder covering the ram, and a housing block fastened to the cylinder to move along the first shaft.

In an exemplary embodiment in accordance with principles of inventive concepts, the plunger comprises a first spring disposed between the housing block and the second slot plate.

In an exemplary embodiment in accordance with principles of inventive concepts, the housing block includes a sliding block coupled to the cylinder and a locking block disposed below the sliding block.

In an exemplary embodiment in accordance with principles of inventive concepts, the sliding block is smaller than the guide hole of the top plate.

In an exemplary embodiment in accordance with principles of inventive concepts, the locking block is larger than the guide hole of the top plate and smaller than the locking holes.

In an exemplary embodiment in accordance with principles of inventive concepts, the locking block is provided to surround the first spring.

In an exemplary embodiment in accordance with principles of inventive concepts, the plunger further comprises a second spring provided in the cylinder and on the ram.

In an exemplary embodiment in accordance with principles of inventive concepts, the cylinder and the housing block include male and female threads engaged with each other.

In an exemplary embodiment in accordance with principles of inventive concepts, a loading magazine, includes holders provided between the first slot plates to stop front and rear sides of the bottom and top plates.

In an exemplary embodiment in accordance with principles of inventive concepts, each of the holders comprises second shafts jointed to upper and lower corners of the first slot plate, rotating springs winding the second shafts, rotating bars configured to rotate parallel to the top plate by the rotating spring, and a vertical bar vertically connecting the rotating bars.

In an exemplary embodiment in accordance with principles of inventive concepts, the bottom plate and the top plate comprise grooves adapted to guide the vertical bar.

In an exemplary embodiment in accordance with principles of inventive concepts, a strip member loading magazine, includes top and bottom plates, and slot plates facing one another and joining the top and bottom plates, wherein the planes of the slot plates are substantially orthogonal to the planes of the top and bottom plates and the slot plates are adapted for holding a plurality of strip members, wherein the slot plates are adapted for repositioning toward or away from one another to thereby accommodate narrower or wider strip members.

In an exemplary embodiment in accordance with principles of inventive concepts, a loading magazine includes an insertable slot plate adapted for insertion into and removal from the loading magazine.

In an exemplary embodiment in accordance with principles of inventive concepts, a loading magazine includes a guide hole positioned in at least one of the top or bottom plates, wherein an insertable slot plate is adapted for coupling with the guide hole and movement under control of the guide hole.

In an exemplary embodiment in accordance with principles of inventive concepts, a loading magazine includes a quick-release locking mechanism to fix the insertable slot plate in a position.

In an exemplary embodiment in accordance with principles of inventive concepts, a loading magazine is adapted for use with semiconductor integrated circuit lead frames.

BRIEF DESCRIPTION OF THE DRAWINGS

Exemplary embodiments in accordance with principles of inventive concepts will be more clearly understood from the following brief description taken in conjunction with the accompanying drawings. The accompanying drawings represent non-limiting, exemplary embodiments as described herein.

FIGS. 6A through 6C are sectional views illustrating a plunger according to a second exemplary embodiment in accordance with principles of inventive concepts It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Exemplary embodiments in accordance with principles of inventive concepts will now be described more fully with reference to the accompanying drawings, in which exemplary embodiments are shown. Exemplary embodiments in accordance with principles of inventive concepts may, however, be embodied in many different forms and should not be construed as being limited to the embodiments set forth herein; rather, these embodiments are provided so that this disclosure will be thorough and complete, and will fully convey the concept of exemplary embodiments to those of ordinary skill in the art. In the drawings, the thicknesses of layers and regions may be exaggerated for clarity. Like reference numerals in the drawings denote like elements, and thus their description may not be repeated.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on"). The word "or" is used in an inclusive sense, unless otherwise indicated.

It will be understood that, although the terms "first", "second", etc. may be used herein to describe various elements, components, regions, layers and/or sections, these elements, components, regions, layers and/or sections should not be limited by these terms. These tell is are only used to distinguish one element, component, region, layer or section from another element, component, region, layer or section. Thus, a first element, component, region, layer or section discussed below could be termed a second element, component, region, layer or section without departing from the teachings of exemplary embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "bottom," "below," "lower," or "beneath" other elements or features would then be oriented "atop," or "above," the other elements or features. Thus, the exemplary terms "bottom," or "below" can encompass both an orientation of above and below, top and bottom. The device may be otherwise oriented (rotated 90 degrees or at other orientations) and the spatially relative descriptors used herein interpreted accordingly.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Figure 1:
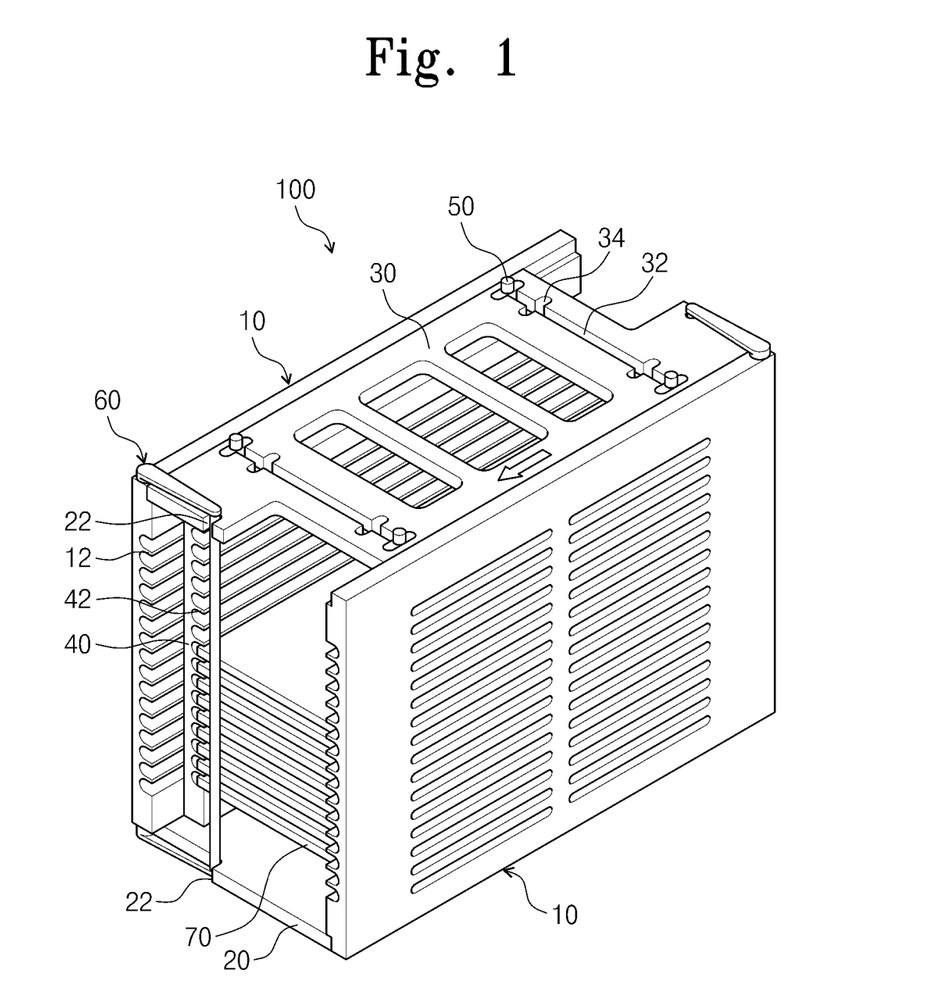
FIG. 1 is a perspective view illustrating an exemplary embodiment of a lead-frame-loading magazine in accordance with principles of inventive concepts.

Exemplary embodiments in accordance with principles of inventive concepts are described herein with reference to cross-sectional illustrations that are schematic illustrations of idealized embodiments (and intermediate structures) of exemplary embodiments. As such, variations from the shapes of the illustrations as a result, for example, of manufacturing techniques and/or tolerances, are to be expected. Thus, exemplary embodiments in accordance with principles of inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of exemplary embodiments. Unless otherwise defined, all terms (including technical and scientific terms) used herein have the same meaning as commonly understood by one of ordinary skill in the art to which exemplary embodiments in accordance with principles of inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Referring to FIGS. 1 through 3, in an exemplary embodiment in accordance with principles of inventive concepts, a lead frame loading magazine 100 may include first slot plates 10, bottom and top plates 20 and 30, second slot plates 40 provided in the first slot plates 10, and a quick-release mechanism, such as plungers 50 fastening the second slot plates 40 to the top plate 30. The top plate 30 may include guide holes 32 and locking holes 34. The plungers 50 may be adapted for sliding along the guide holes 32 and for fastening at the locking holes 34. In exemplary embodiments in accordance with principles of inventive concepts, a plurality of the locking holes 34 may be formed in each of the guide holes 32. The plungers 50 may be used as locking units of the second slot plates 40, which may be moved along the guide hole 32 of the top plate 30 and fastened at the locking hole 34. The plungers 50 may be configured to control a space between the second slot plates 40.

Accordingly, exemplary embodiments of a lead-frame-loading magazine in accordance with principles of inventive concepts can be used to contain lead frames 70 of different sizes by sliding and locking second slot plates 40 at different positions in guide holes 32.

That is, in accordance with principles of inventive concepts, an adjustable-width loading magazine accommodates strip members of various sizes. In exemplary embodiments in accordance with principles of inventive concepts, top and bottom plates are joined on two sides by slot plates to form an open box. Strip members, such as lead frames, may be carried on the slots provided by the slot plates. Additional slot plates may be inserted into the box to form narrower-width carriers for narrower strip members. In exemplary embodiments in accordance with principles of inventive concepts, the additional slot plates, also referred to herein as second slot plates or adjustable slot plates, are adapted for sliding along guide holes to adjust the width of strip member they may carry. Lock holes may be employed to, at least temporarily, fix the adjustable slot plates at a specific position. In accordance with principles of inventive concepts, a plunger-release mechanism may be included to allow for ready adjustment of the position of adjustable slot plates along the guide holes. In exemplary embodiments in accordance with principles of inventive concepts, the adjustable slot plates may be removed from the loading magazine by disjoining the plunger mechanism, for example.

In an exemplary embodiment in accordance with principles of inventive concepts, first slot plates 10 may be provided at either side of each of the bottom and top plates 20 and 30 and may include a plurality of first slot lines 12 that are parallel to the bottom and top plates 20 and 30, respectively. The lead frames 70 may be contained in the first slot lines 12. In exemplary embodiments in accordance with principles of inventive concepts, the first slot lines 12 may face each other. In exemplary embodiments in accordance with principles of inventive concepts, if the second slot plates 40 are removed from the first slot plates 10, lead frames 70 having a width of about 77.5mm may be loaded in the first slot lines 12.

In exemplary embodiments in accordance with principles of inventive concepts, the bottom plate 20 may be formed to fasten a first lower corner 16 of the first slot plate 10 and support a second lower corner 46 of the second slot plate 40. The bottom plate 20 may be formed to have the same length as the first slot plates 10 and the top plate 30. Each of the bottom and top plates 20 and 30 may include a groove 22, which may be adapted to guide a vertical bar 68 of a stopper 60.

The top plate 30 may be disposed parallel to the bottom plate 20 to fasten first upper corners 14 of the first slot plates 10 and cover second upper corners 44 of the second slot plates 40. The top plate 30 may include the guide holes 32 and the locking holes 34. The plungers 50 may be slid along the guide holes 32 and be fastened at the locking holes 34. In exemplary embodiments in accordance with principles of inventive concepts, indicators may be located on the top plate 30 adjacent to the locking holes 34 (by etching, carving, or printing, for example) to indicate a size of the lead frame 70 suitable for placement in the second slot plates 40.

The first slot plates 10 and the bottom and top plates 20 and 30 may be shaped like an opened box, whose front and back sides are open, for example. An indicator, such as an arrow 38 may be included on the top plate 30 to indicate the front and rear of the box-shaped magazine 100. The stoppers 60 may be disposed at the front and rear of the bottom and top plates 20 and 30, between the first slot plates 10.

Figure 2:
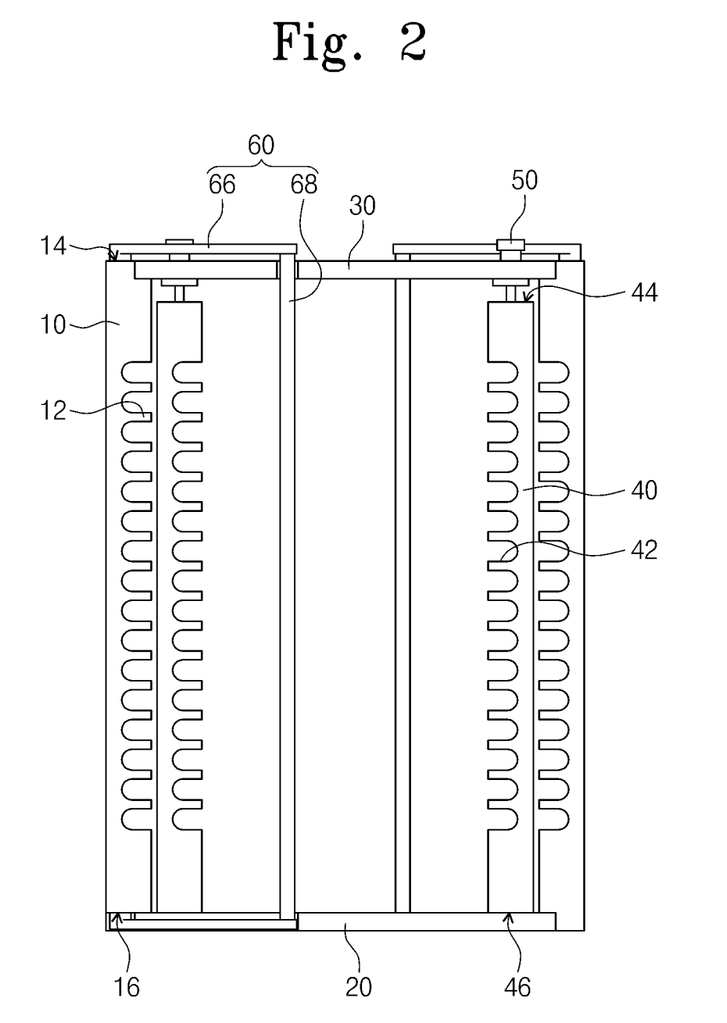
FIGS. 2 and 3 are front and plan views of the lead frame loading magazine of FIG. 1.
Figure 3:
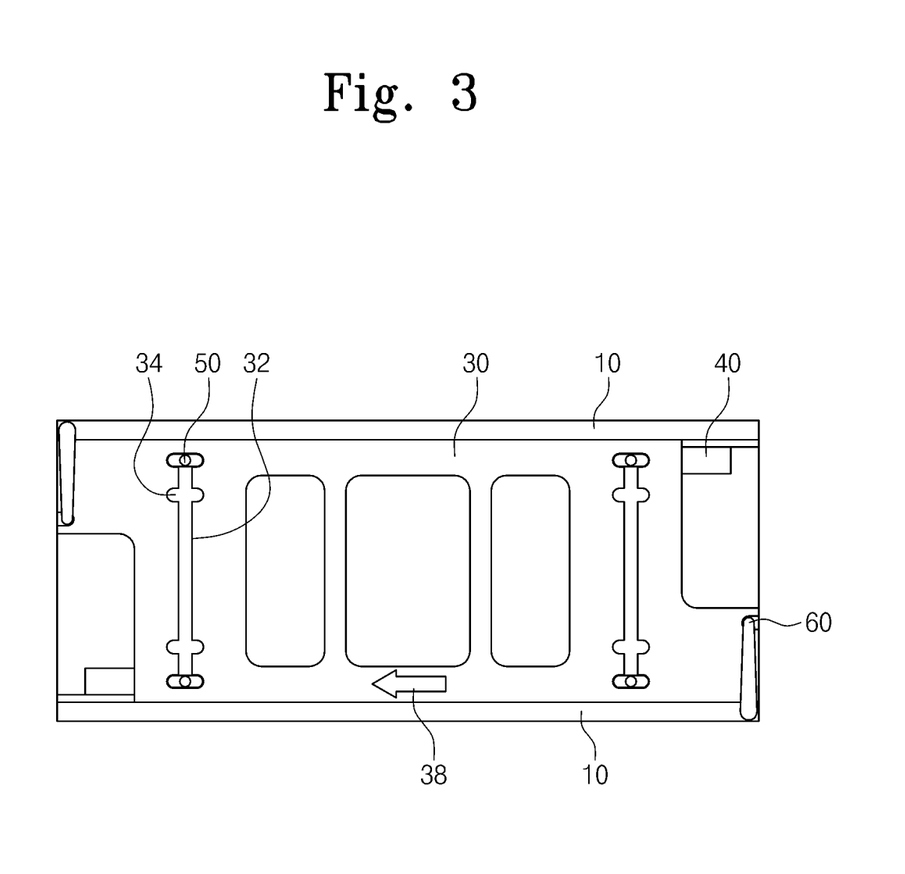
Figure 4:
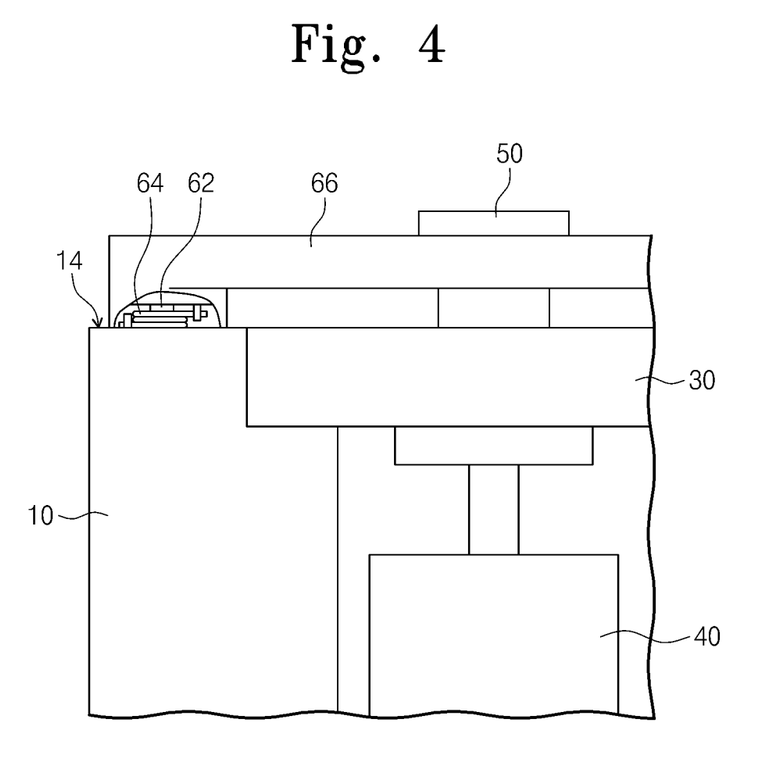
FIG. 4 is an enlarged diagram illustrating a first shaft, a rotating spring, and a rotating bar of a stopper that is interlocked to the first upper corner of FIG. 2.

Referring to FIGS. 2 and 4, in exemplary embodiments in accordance with principles of inventive concepts the stopper 60 may include first shafts 62, rotating springs 64, rotating bars 66, and a vertical bar 68. The first shafts 62 may be inserted into the first upper corner 14 and the first lower corner 16, respectively, and the rotating springs 64 may be provided to wind around the first shafts 62. The rotating bars 66 may be configured to rotate parallel to the top plate 30 by the rotating spring 64, and the vertical bar 68 may be disposed to connect the rotating bars 66 of the first upper corner 14 and the first lower corner 16. In exemplary embodiments in accordance with principles of inventive concepts, the rotating bar 66 may be rotated from a direction perpendicular to the first slot plates 10 to a direction parallel to the first slot plates 10. That is, in exemplary embodiments in accordance with principles of inventive concepts, an azimuthal rotation angle of the rotating bar 66 may be about, that is, approximately, 90°. A rotational movement of the vertical bar 68 may be decided by the rotating bar 66. For example, depending on the position of the rotating bar 66, the vertical bar 68 may be positioned across the bottom and top plates 20 and 30. In such an exemplary embodiment, the vertical bar 68 may be inserted into the grooves 22 of the bottom and top plates 20 and 30. Although not shown, the vertical bar 68 may be rotated by the rotating bar 66 to be parallel to the first slot plates 10. Accordingly, the stopper 60 may prevent the lead frames 70 in the first or second slot plates 10 or 40 from falling out, during delivery of the magazine 100 for example.

The second slot plates 40 may include second slot lines 42 of the same size as the first slot lines 12. The second slot lines 42 may be disposed to face each other. In exemplary embodiments in accordance with principles of inventive concepts the second slot plates 40 may be smaller than the first slot plates 10 in terms of length and height. The second slot plates 40 may be fixed parallel to the first slot plates 10 by the top plate 30 and the plungers 50, for example, and the second upper corner 44 of the second slot plates 40 may be fixed by the plungers 50.

The plungers 50 may be provided in the guide holes 32 and/or the locking holes 34 of the top plate 30. The plungers 50 will be described in more detail in the discussion related to FIGS. 5A through 5C, and/or FIGS. 6A through 6C.

Figure 5A:
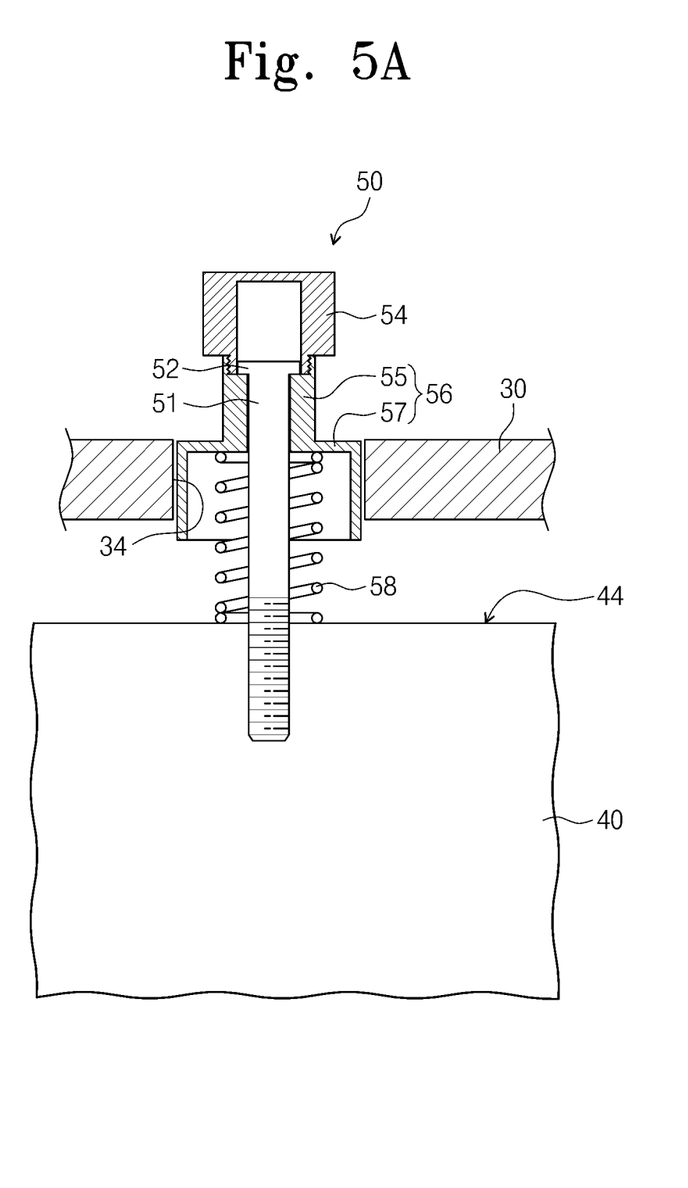
FIGS. 5A through 5C are sectional views illustrating a plunger according to a first exemplary embodiment in accordance with principles of inventive concepts.
Figure 5B:
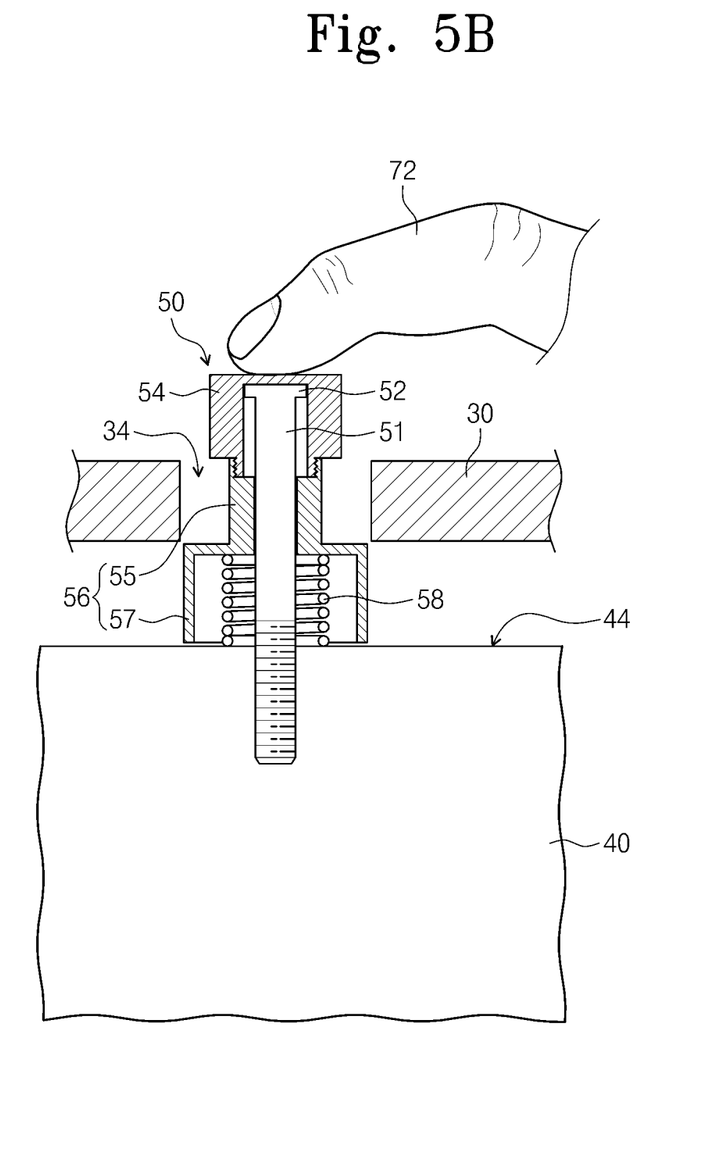
Figure 5C:
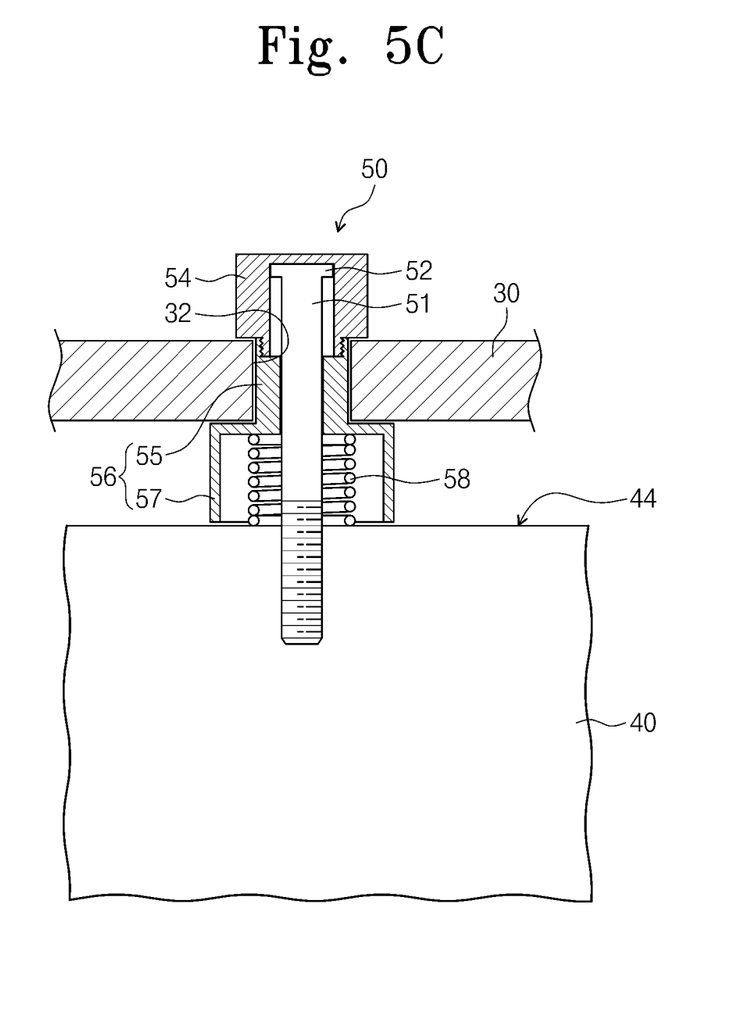

Referring to FIGS. 5A through 5C, according to a first exemplary embodiment in accordance with principles of inventive concepts, the plunger 50 may include a second shaft 51 fixed to the second upper corner 44 of the second slot plate 40, a ram 52 provided on the second shaft 51, a cylinder 54 covering the ram 52, a housing block 56 fixed to the cylinder 54 to move along the second shaft 51, and a first spring 58 provided between the housing block 56 and the second slot plate 40.

The ram 52 may include a bolt-shaped portion inserted into the second slot plate 40. The cylinder 54 and the housing block 56 may be reciprocated along the ram 52 and the second shaft 51. The cylinder 54 and the housing block 56 may be male and female screws, that is, screws that can be engaged with each other. The first spring 58 may provide a restoring force between the housing block 56 and the second slot plate 40. The housing block 56 may include a sliding block 55 coupled to the cylinder 54 and a first locking block 57 provided below the sliding block 55. The sliding block 55 may be configured to restrict movement of the ram 52 provided in the cylinder 54. The sliding block 55 may be of a width smaller than the guide hole 32 of the top plate 30. The first locking block 57 may be of a width that is greater than the guide hole 32 and in exemplary embodiments in accordance with principles of inventive concepts may be of a width substantially the same as the locking holes 34 of the top plate 30. The first locking block 57 may be provided to surround the first spring 58, and may be inserted into the locking hole 34 of the top plate 30, as shown in FIG. 5A, when it is fastened to the second slot plate 40. As shown in FIG. 5B, the first locking block 57 may descend from the locking hole 34, when an external force, for example from a finger 72, is exerted thereon. In exemplary embodiments in accordance with principles of inventive concepts the sliding block 55 may be moved in the guide hole 32, as shown in FIG. 5C, to change the space between the second slot plates 40. Activation of the plunger 50 allows for ready movement and locking engagement of the second slot plate 40 and, as a result, the second slot plates 40 may contain the lead frame 70 of various sizes.

Although not shown, the second slot plates 40 may be separated from the magazine 100 by disjointing the plunger 50. For example, the cylinder 54 of the plunger 50 may be rotated and separated from the housing block 56, the ram 52 and the second shaft 51 may be rotated and separated from the second slot plate 40, the housing block 56 and the first spring 58 may be extracted from a space between the second upper corner 44 of the second slot plate 40 and the top plate 30 through the locking hole 34 of the top plate 30. With the second slot plates removed from the magazine 100, the lead frames 70 may be disposed in the first slot plates 10, respectively, thereby accommodating larger lead frames. Accordingly, it is possible to increase productivity of a lead-frame-loading magazine in accordance with principles of inventive concepts.

Figure 6A:
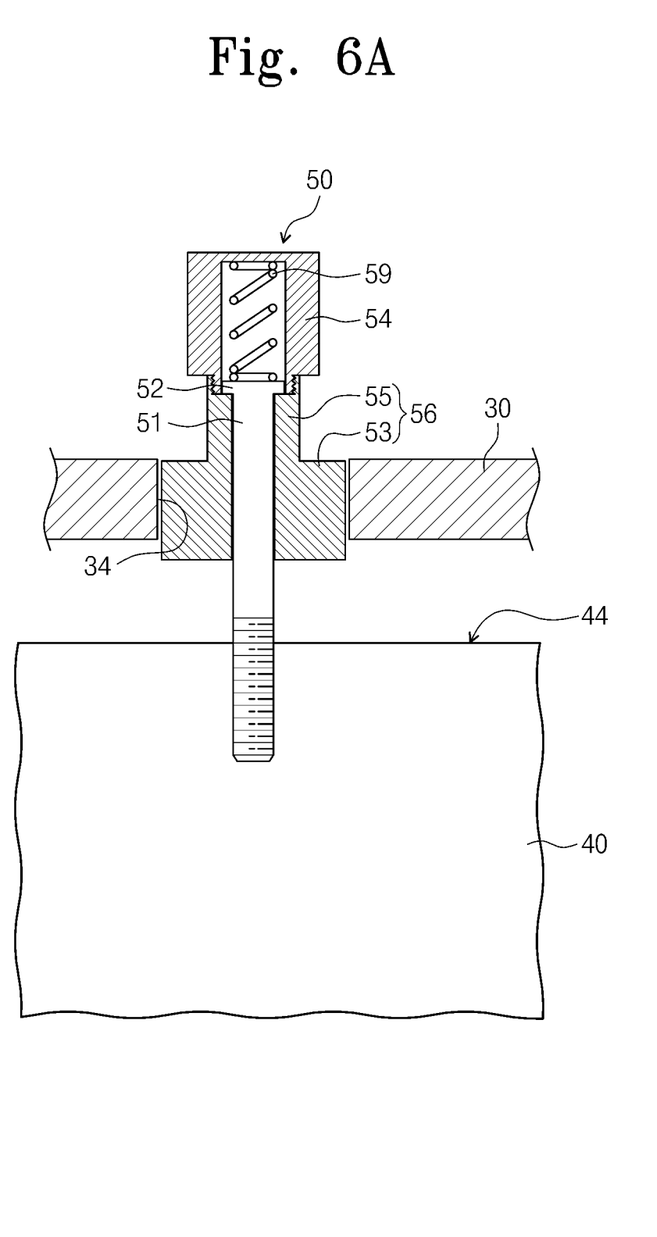
Figure 6B:
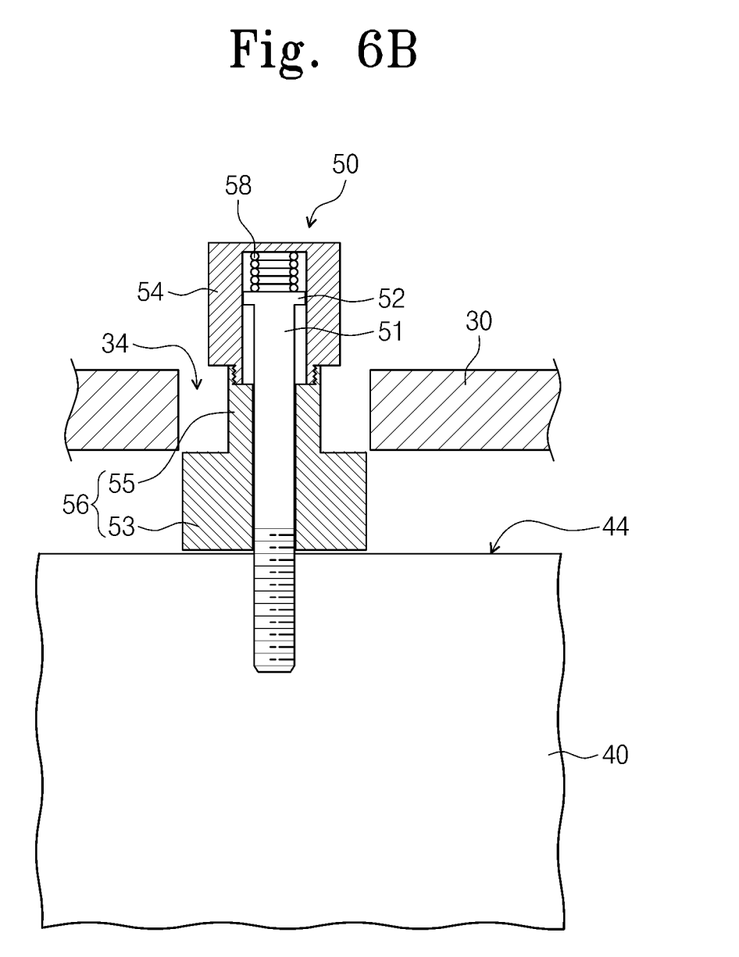
Figure 6C:
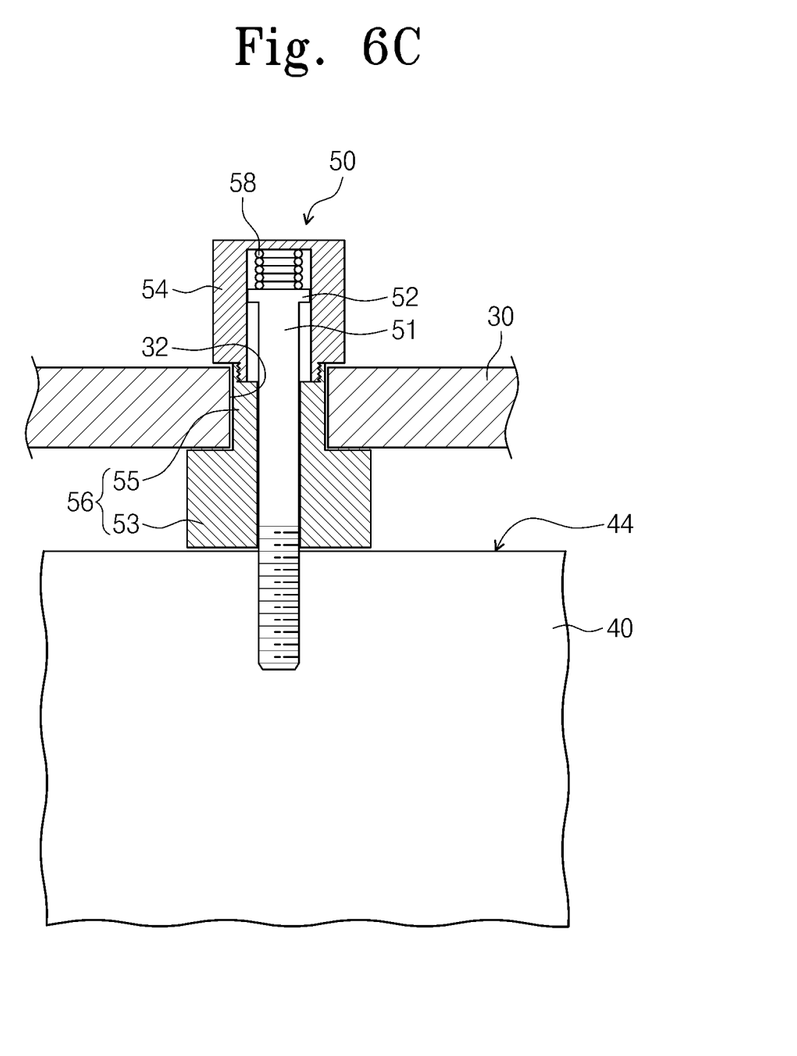

Referring to FIGS. 6A through 6C, according to a second exemplary embodiment in accordance with principles of inventive concepts, the plunger 50 may include the second shaft 51, the ram 52 provided on the second shaft 51, the cylinder 54 covering the ram 52, a second spring 59 provided on the ram 52 in the cylinder 54, and the housing block 56 fixed to the cylinder 54 to move along the second shaft 51. The second spring 59 may provide a restoring force between the ram 52 and the cylinder 54. The housing block 56 may be jointed to the cylinder 54 with a screw. The housing block 56 may include the sliding block 55 fixed to the cylinder 54 and a second locking block 53 provided below the sliding block 55. The second locking block 53 may have a bottom surface, which may be entirely in contact with the second upper corner 44.

In this exemplary embodiment in accordance with principles of inventive concepts, the housing block 56 may be moved outward from the second upper corner 44 of the second slot plate 40 by the restoring force from the second spring 59. The second locking block 53 of the housing block 56 may be inserted into the locking hole 34 to fasten the second slot plate 40 to the top plate 30, as shown in FIG. 6A. In accordance with principles of inventive concepts, the second locking block 53 may be separated from the locking hole 34, as shown in FIG. 6B, by lowering the finger 72, the cylinder 54, and the sliding block 55 in order to change the space between the second slot plates 40. Thereafter, the sliding block 55 may be moved along the guide hole 32, as shown in FIG. 6C. In order to remove the second slot plates 40 from the magazine 100, the plunger 50 may be disjoined, or disassembled. To remove the second slot plates, the cylinder 54 of the plunger 50 may be rotated and separated from the housing block 56. Then, if the second spring 59 is removed, the ram 52 and the second shaft 51 may be separated from the second slot plate 40. The housing block 56 and the first spring 58 may then be extracted from the locking hole 34 of the top plate 30. In accordance with principles of inventive concepts, by adding second slot plate 40 to loading magazine 100 or removing second slot plate 40 from loading magazine 100, the magazine 100 may contain the lead frame 70 of various sizes and, as a result, processes employing a loading magazine 100 in accordance with principles of inventive concepts may provide increased efficiency and productivity.

According to exemplary embodiments in accordance with principles of inventive concepts, first slot plates may be fastened to bottom and top plates, and second slot plates are disposed between the first slot plates. The second slot plates may be configured in such a way that an interval therebetween can be modified. The second slot plates may include plungers, which are provided to be movable along a guide hole of the top plate. The plungers may be fastened to locking holes connected to the guide hole. Accordingly, lead frames of various sizes can be loaded in the second slot plates. The plungers may be disjoined in the locking holes, when the second slot plates are separated from the first slot plates.

This enables to increase productivity of the loading magazine.

While example embodiments of the inventive concepts have been particularly shown and described, it will be understood by one of ordinary skill in the art that variations in form and detail may be made therein without departing from the spirit and scope of the attached claims.

What is claimed is:

1. A strip member loading magazine, comprising:
    a substantially planar bottom plate;
    a plurality of first slot plates provided at opposite sides of the bottom plate and substantially orthogonal to the plane of the bottom plate;
    a substantially planar top plate fixed to a top portion of each of the first slot plates to be parallel to the plane of the bottom plate;
    second slot plates disposed to face each other between the first slot plates, wherein the second slot plates are adapted for movement in a direction parallel to the bottom and top plates; and
    locking units fastening the second slot plates to the top plate, the second slot plates being fastened parallel to the first slot plates.

2. The magazine of claim 1, wherein the locking units are disposed at upper corners of the second slot plates, respectively.

3. The magazine of claim 2, wherein the top plate includes a guide hole adapted for sliding the locking units therein to move the second slot plates and the top plate includes locking holes defining fastening positions of the second slot plates in the guide hole.

4. The magazine of claim 3, wherein the locking units comprises a plunger to be inserted into the guide hole or the locking holes.

5. The magazine of claim 3, wherein the plunger comprises:
   a first shaft fastened to the second slot plate;
   a ram provided on the first shaft;
   a cylinder covering the ram; and
   a housing block fastened to the cylinder to move along the first shaft.

6. The magazine of claim 5, wherein the plunger comprises a first spring disposed between the housing block and the second slot plate.

7. The magazine of claim 6, wherein the housing block comprises a sliding block coupled to the cylinder and a locking block disposed below the sliding block.

8. The magazine of claim 7, wherein the sliding block is of smaller width than the guide hole of the top plate.

9. The magazine of claim 7, wherein the locking block is of larger width than the guide hole of the top plate and smaller than the locking holes.

10. The magazine of claim 6, wherein the locking block is provided to surround the first spring.

11. The magazine of claim 5, wherein the plunger further comprises a second spring provided in the cylinder and on the ram.

12. The magazine of claim 5, wherein the cylinder and the housing block include male and female threads engaged with each other.

13. The magazine of claim 1, further comprising holders provided between the first slot plates to hold front and rear sides of the bottom and top plates.

14. The magazine of claim 13, wherein each of the holders comprises second shafts jointed to upper and lower corners of the first slot plate, rotating springs winding the second shafts, rotating bars configured to rotate parallel to the top plate by the rotating springs, and a vertical bar vertically connecting the rotating bars.

15. The magazine of claim 13, wherein the bottom plate and the top plate comprise grooves adapted to guide the vertical bar.

16. A strip member loading magazine, comprising:
   substantially planar top and bottom plates; and
   slot plates facing one another and joining the top and bottom plates to form the frame of the loading magazine, wherein the planes of the slot plates are substantially orthogonal to the planes of the top and bottom plates and the slot plates include slots for holding a plurality of strip members, wherein one of the top and bottom plates includes guide holes for positioning one said slot plate to thereby accommodate strip members of different widths.

17. The loading magazine of claim 16, wherein the slot plates facing one another are
   edge slot plates fixed at opposite sides of the top and bottom plates, and the magazine includes at least one insertable slot plate disposed between edge slot plates within the frame of the loading magazine, the insertable slot plate disposed in a direction parallel to the edge slot plates, and guided in position by one of the top and bottom plates.

18. The loading magazine of claim 17, wherein at least one of the top and bottom plates has a guide hole positioned in at least one of the top and bottom plates, and
   wherein the insertable slot plate is adapted for coupling with the guide hole and movement under control of the guide hole.

19. The loading magazine of claim 18, further comprising a quick-release locking mechanism to fix the insertable slot plate in a position.

20. The loading magazine of claim 19, wherein the magazine is adapted for use with semiconductor integrated circuit lead frames.

* * * * *